(12) United States Patent
Mason et al.

(10) Patent No.: US 7,068,038 B2
(45) Date of Patent: Jun. 27, 2006

(54) 240 VOLT OUTLET TESTER

(75) Inventors: Larry Boyd Mason, Bucyrus, OH (US); Dave Paul Lock, Waldo, OH (US); Philip Andrew Molloy, Marion, OH (US); Ronald Dale Patrick, Marion, OH (US)

(73) Assignee: Whirlpool Corporation, Bewnton Harbor, MI (US)

( * ) Notice: Subject to any disclaimer, the term of this patent is extended or adjusted under 35 U.S.C. 154(b) by 0 days.

(21) Appl. No.: 10/866,223

(22) Filed: Jun. 11, 2004

(65) Prior Publication Data

US 2005/0275409 A1   Dec. 15, 2005

(51) Int. Cl.
*G01R 31/00* (2006.01)

(52) U.S. Cl. .................. 324/508; 324/133
(58) Field of Classification Search ............ 324/508, 324/133
See application file for complete search history.

(56) References Cited

U.S. PATENT DOCUMENTS

| | | | |
|---|---|---|---|
| 2,598,775 A | 6/1952 | Fischer ................ 175/183 |
| 3,383,588 A | 5/1968 | Stoll et al. ............ 324/508 |
| 3,783,371 A | 1/1974 | McMillan .............. 324/508 |
| 3,967,195 A | 6/1976 | Averitt et al. .......... 324/508 |
| 3,984,765 A | 10/1976 | Rocci, Jr. ............. 324/508 |
| 5,109,200 A * | 4/1992 | Dushane et al. ........ 324/508 |
| 6,137,285 A * | 10/2000 | Walsten et al. ......... 324/133 |
| 6,828,796 B1 * | 12/2004 | Vang ................... 324/508 |
| 2005/0176286 A1 * | 8/2005 | Waldschmidt .......... 439/394 |

* cited by examiner

*Primary Examiner*—Walter Benson
(74) *Attorney, Agent, or Firm*—John F. Colligan; Robert O. Rice; Stephen Krefman (57) ABSTRACT

A 240 volt outlet tester is described. The 240 volt outlet tester includes a housing with three or four prongs extending outwardly from a base of the housing. The prongs are designed so that they can be inserted into either a three or four wire 240 volt outlet. Indicator lights are integrated into the housing. A test circuit is located within the housing. The test circuit is designed to detect whether the 240 volt outlet has been wired correctly. If the 240 volt outlet is correctly wired, all the indicator lights integrated into the housing illuminate. If the 240 volt outlet is improperly wired, one or more indicator lights do not illuminate.

28 Claims, 6 Drawing Sheets

240 VOLT OUTLET TESTER

FIELD

The present invention relates generally to outlet testers, and more particularly, relates to a 240 volt outlet tester.

BACKGROUND

Outlet testers have been used to detect whether the wiring to a 120 volt outlet is correctly installed. An outlet may also be referred to as a receptacle or a socket. A properly designed 120 volt outlet includes a live or hot terminal, a neutral terminal, and a ground terminal. Typical 120 volt outlet testers include a lamp and a resistor connected in series between the live terminal and the neutral terminal, the live terminal and the ground terminal, and the neutral terminal and the ground terminal. The 120 volt outlet testers are typically exposed to approximately 15 amps of current and the lamps and resistors in the tester are selected accordingly.

If the 120 volt outlet is wired correctly, the circuit between each of the terminals will be completed causing the lamps to illuminate. However, if the 120 volt outlet is improperly wired, a leg of the circuit will not be completed causing at least one of the lamps to remain unlit. The wiring problem may be identified based on which lamps do not illuminate after the 120 volt outlet tester has been placed in the outlet. By testing the wiring to the 120 volt outlet prior to plugging an electronic device into the outlet, damage to the electronic device caused by improper wiring may be avoided.

Some electronic devices, such as clothes dryers and electric ranges, are plugged into 240 volt outlets. A three prong 240 volt electric outlet includes two live or hot terminals and a neutral terminal. A four prong 240 volt electric outlet includes two live or hot terminals, a neutral terminal, and a ground terminal. The 240 volt circuits are typically 30 amp circuits for dryers or 50 amp circuits for electric ranges. Thus, a 240 volt outlet tester would be exposed to current levels two to three times higher than a 120 volt outlet tester. A circuit designed for use within a 120 volt outlet tester would be severely damaged if used in a 240 volt outlet application. Because of the differences in terminal design, plug design, and the amount of current and voltage supplied at the outlet, a 240 volt outlet cannot be tested using an outlet tester designed for a 120 volt outlet.

An improperly wired 240 volt outlet is a safety hazard and may cause damage to a clothes dryer, an electric range, or other electronic device that is plugged into the improperly wired 240 volt outlet. Additionally, some wiring errors may cause an electronic device chassis to become "hot," which may electrocute a person contacting the chassis causing severe injury or even death. Accordingly, there needs to be a way to test 240 volt outlets prior to plugging a device into the 240 volt outlet.

SUMMARY

A 240 volt outlet tester is described. The 240 volt outlet tester includes a housing with three or four prongs extending out from a base of the housing. The prongs are designed so that they can be inserted into a three or four wire 240 volt outlet. Indicator lights are integrated into the housing. A three prong 240 volt outlet tester may have two indicator lights, while a four prong 240 volt outlet tester may have three indicator lights. The indicator lights may be located anywhere on the 240 volt tester. Preferably, the indicator lights are located on a top portion of the housing opposite from the base of the housing so that when the prongs are inserted into the 240 volt outlet, the indicator lights can be easily viewed.

A test circuit is located within the housing. The test circuit is designed to detect whether the 240 volt outlet has been wired correctly. In the three prong 240 volt outlet tester, the test circuit includes two parallel circuits. The first parallel circuit is connected between a first live terminal and a neutral terminal and includes a first resistor connected in parallel with an indicator light connected in series with a second resistor. The second parallel circuit is connected between the first live terminal and a second live terminal and includes a first resistor connected in parallel with an indicator light connected in series to a second resistor. A line resistor may also be connected between the second live terminal and the second parallel circuit.

In the four prong 240 volt outlet tester, the test circuit includes three parallel circuits. The first parallel circuit is connected between a first live terminal and a ground terminal and includes a first resistor connected in parallel with an indicator light connected in series with a second resistor. The second parallel circuit is connected between the first live terminal and a second live terminal and includes a first resistor connected in parallel with an indicator light connected in series with a second resistor. A line resistor may also be connected between the second live terminal and the second parallel circuit. The third parallel circuit is connected between the second live terminal and a neutral terminal and includes a first resistor connected in parallel with an indicator light connected in series with a second resistor.

If the 240 volt outlet is correctly wired, all the indicator lights integrated into the housing may illuminate. If the 240 volt outlet is improperly wired, one or more indicator lights might not illuminate. The illumination pattern (i.e., which indicator lights are illuminated) may be used to determine how the 240 volt outlet is improperly wired. By identifying an improperly wired 240 volt outlet prior to usage, damage to individuals and electronic devices that may be plugged into such an outlet may be avoided.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

I. Three Prong, 240 Volt Outlet Tester

Figure 1:
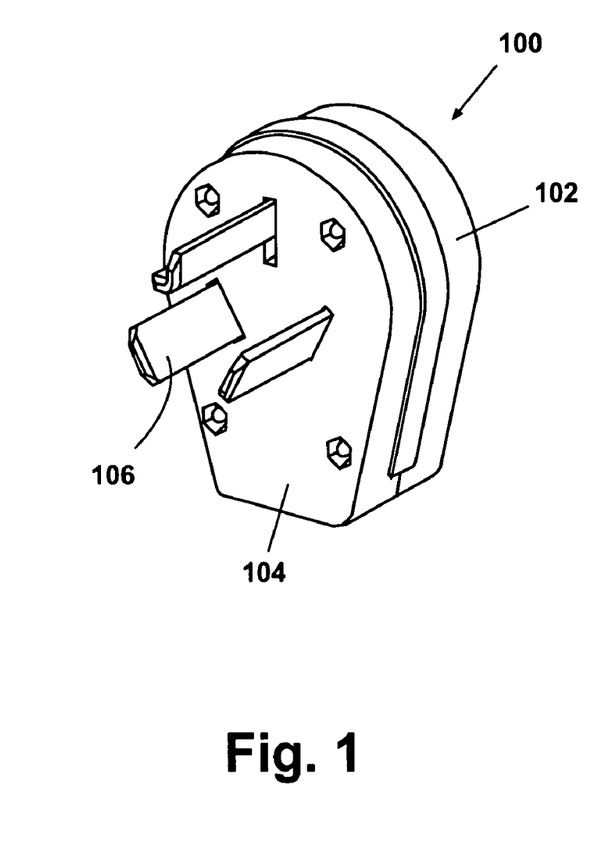
FIG. 1 is a bottom view of a three prong 240 volt outlet tester, according to an embodiment.

FIG. 1 is a bottom view of a three prong 240 volt outlet tester 100. The three prong 240 volt outlet tester 100 is designed to be plugged into a three wire 240 volt outlet. The three prong 240 volt outlet tester 100 may resemble a plug head on a power cord attached to an electronic device that receives power from a three wire 240 volt outlet.

The three prong 240 volt outlet tester 100 may include a housing 102. The housing 102 may be in a shape of a cube or other three-dimensional shape. The housing 102 may be composed of a non-conductive, impact resistant material and may include safety hand grip areas to guard against electrocution. The housing 102 may include a bottom or base 104 from which three prongs 106 may extend outwardly. The three prongs 106 may be sized and arranged on the base 104 so that the three prong 240 volt outlet tester 100 may be inserted into a three wire 240 volt outlet. When the prongs 106 are inserted into the three wire 240 volt outlet, the prongs 106 may contact a first live or hot terminal, a second live or hot terminal, and a neutral terminal. The prongs 106 may be composed of materials similar to those used on a power cord of an electronic device that receives power from the three wire 240 volt outlet.

Figure 2:
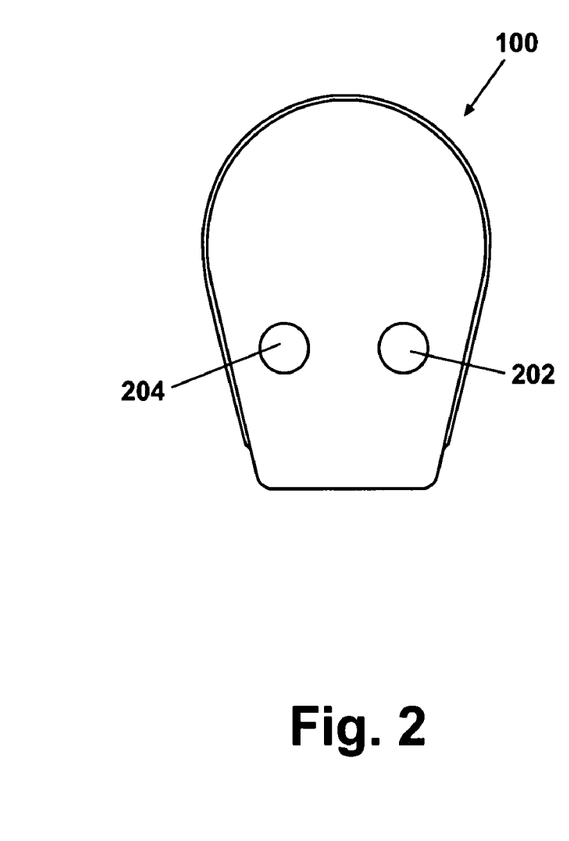
FIG. 2 is a top view of a three prong 240 volt outlet tester, according to an embodiment.

FIG. 2 is a top view of a three prong 240 volt outlet tester 100. The three prong 240 volt outlet tester 100 may have two indicator lights 202, 204 integrated into the housing 102. The indicator lights 202, 204 may preferably be composed from long life, impact resistant materials. For example, the indicator lights 202, 204 may be LED or neon lights.

The indicator lights 202, 204 may be used to identify a wiring status of the wiring to the three wire 240 volt outlet. For example, if the wiring to the three wire 240 volt outlet is correct and the 240 volt outlet tester 100 is placed into the outlet, the indicator lights 202, 204 may illuminate. In a preferred embodiment, the indicator lights 202, 204 illuminate green (i.e., green indicating that the wiring to the outlet is correct). Additional information regarding how the indicator lights 202, 204 may be used to identify the wiring status of the three wire 240 volt outlet is described with reference to FIG. 4.

The three prong 240 volt outlet tester 100 may include a test circuit within the housing 102. The test circuit may be connected to the three prongs 106 and to the two indicator lights 202, 204. The test circuit is designed to detect whether the three wire 240 volt outlet has been wired correctly.

Figure 3:
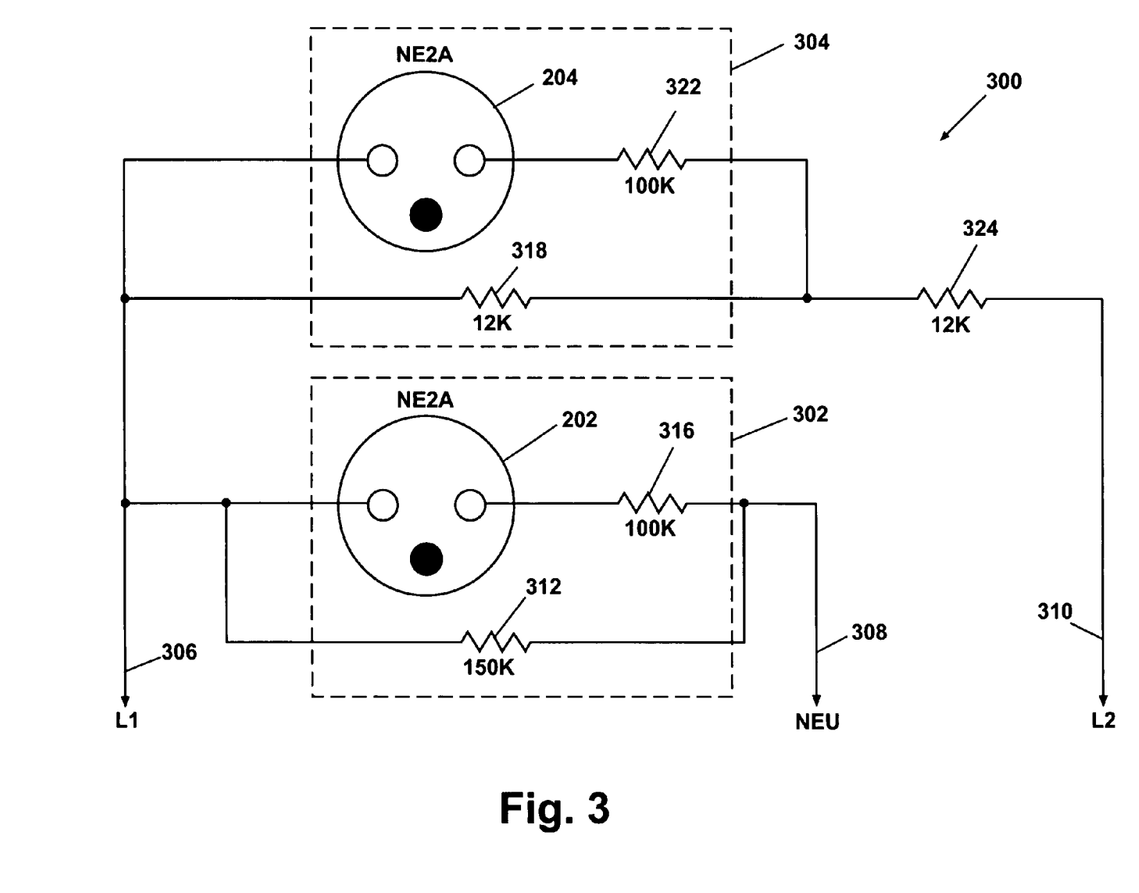
FIG. 3 is a circuit diagram for a test circuit located within the three prong 240 volt outlet tester depicted in FIG. 1, according to an embodiment.

FIG. 3 is a circuit diagram of a test circuit 300 located within the housing 102 of the three prong 240 volt outlet tester 100 depicted in FIG. 1. The test circuit 300 includes two parallel circuits 302, 304. The first parallel circuit 302 is connected between a first live terminal 306 and a neutral terminal 308 and includes a first parallel resistor 312 connected in parallel with a first indicator light 202 connected in series to a first series resistor 316.

The first parallel resistor 312 may discharge capacitance created by a long length of house wiring. Capacitive coupling between conductors of a power cable can make a small amount of power available to a neutral terminal (and to a ground terminal used in a four wire 240 volt outlet design) even if one of the conductors is not connected to the main circuit. This small amount of power, sometimes referred to as "phantom" power, may be sufficient to illuminate an indicator light. By discharging the capacitance using the first parallel resistor 312, the first indicator light 202 may only illuminate if the three wire 240 volt outlet is properly wired. The first series resistor 316 may be a current limiter for the first indicator light 202.

In a preferred embodiment, the first parallel resistor 312 has a resistance of about 150 kilo ohms and the first series resistor 316 has a resistance about 100 kilo ohms. Other resistance values may be used. The first indicator light 202 may be an NE2A neon bulb; however, other indicator lights may be used.

The second parallel circuit 304 is connected between the first live terminal 306 and a second live terminal 310 and includes a second parallel resistor 318 connected in parallel with a second indicator light 204 connected in series to a second series resistor 322. A line resistor 324 may be connected in series between the second parallel circuit 304 and the second live terminal 310. The second parallel resistor 318 and the line resistor 324 may discharge capacitance created by a long length of house wiring. The second series resistor 322 may be a current limiter for the second indicator light 204.

In a preferred embodiment, the second parallel resistor 318 has a resistance of about 12 kilo ohms, the second series resistor 322 has a resistance about 100 kilo ohms, and the line resistor 324 has a resistance about 12 kilo ohms. Other resistance values may be used. The second indicator light 204 may be an NE2A neon bulb; however, other indicator lights may be used.

Figure 4:
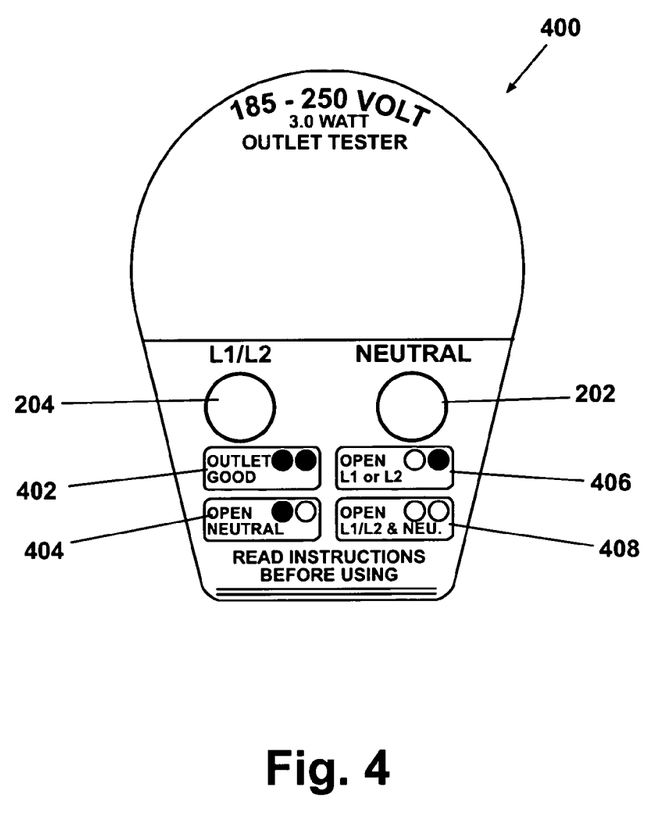
FIG. 4 is a label for use on the three prong 240 volt outlet tester depicted in FIG. 1, according to an embodiment.

FIG. 4 is a label 400 for use on the three prong 240 volt outlet tester 100 depicted in FIG. 1. The label 400, which may be attached to the top side of the three pronged 240 volt outlet tester 100, may be useful to explain how the test circuit 300 including the indicator lights 202, 204 may be used to identify whether a three wire 240 volt outlet is correctly wired. After the three prong 240 volt outlet tester 100 is placed into a three wire 240 volt outlet, the indicator lights 202, 204 may or may not illuminate. An illumination pattern may provide a status of the wiring to the three wire 240 volt outlet.

If the wiring to the 240 volt outlet is correct, both indicator lights 202, 204 may illuminate as depicted in block 402. If the wiring to the neutral terminal is incorrect, the second indicator light 204 may illuminate, but not the first indicator light 202 as depicted in block 404. If the wiring to one of the two live terminals is incorrect, the first indicator light 202 may illuminate, but not the second indicator light 204 as depicted in block 406. If the wiring to the neutral terminal and one of the live terminals is incorrect, neither of the indicator lights 202, 204 may illuminate as depicted in block 408. The following table summarizes the illumination pattern for the three prong 240 volt outlet tester 100.

| 240 Volt Outlet Status | Neutral 202 | L1/L2 204 |
| --- | --- | --- |
| Wired Correctly | ON | ON |
| Neutral Terminal Improperly Wired | OFF | ON |
| Live Terminal Improperly Wired | ON | OFF |
| Both Neutral and Hot Terminal Improperly Wired | OFF | OFF |

II. Four Prong, 240 Volt Outlet Tester

Figure 5:
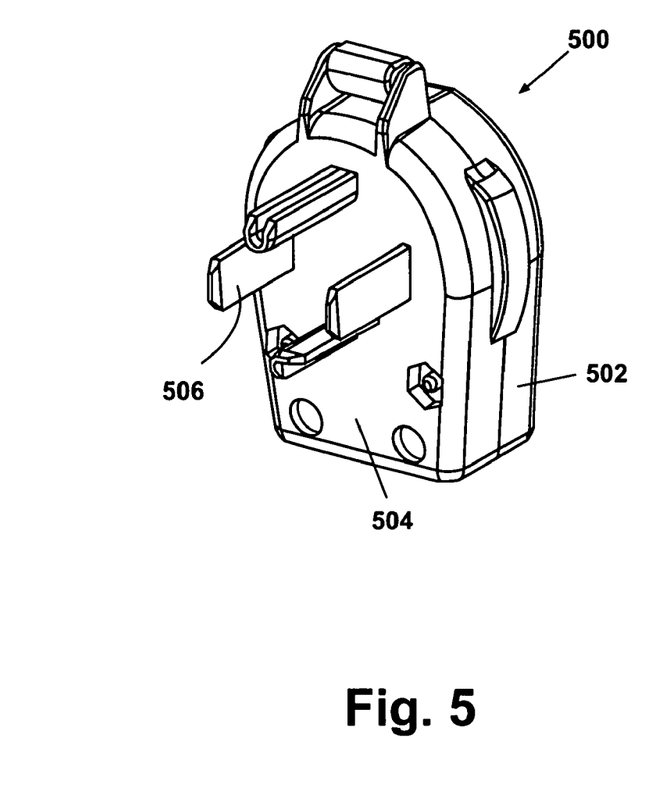
FIG. 5 is a bottom view of a four prong 240 volt outlet tester, according to an embodiment.

FIG. 5 is a bottom view of a four prong 240 volt outlet tester 500. The four prong 240 volt outlet tester 500 is designed to be plugged into a four wire 240 volt outlet. The four prong 240 volt outlet tester 500 may resemble a plug head on a power cord attached to an electronic device that receives power from a four wire 240 volt outlet.

The four prong 240 volt outlet tester 500 may include a housing 502. The housing 502 may be in a shape of a cube or other three-dimensional shape. The housing 502 may be composed of a non-conductive, impact resistant material and may include safety hand grip areas to guard against electrocution. The housing 502 may include a bottom or base 504 from which four prongs 506 may extend outwardly. The four prongs 506 may be sized and arranged on the base 504 so that the four prong 240 volt outlet tester 500 may be inserted into a four wire 240 volt outlet. When the prongs 506 are inserted into the four wire 240 volt outlet, the prongs 506 may contact a first live or hot terminal, a second live or hot terminal, a neutral terminal, and a ground terminal. The prongs 506 may be composed of materials similar to those used on a power cord of an electronic device that receives power from the four wire 240 volt outlet.

Figure 6:
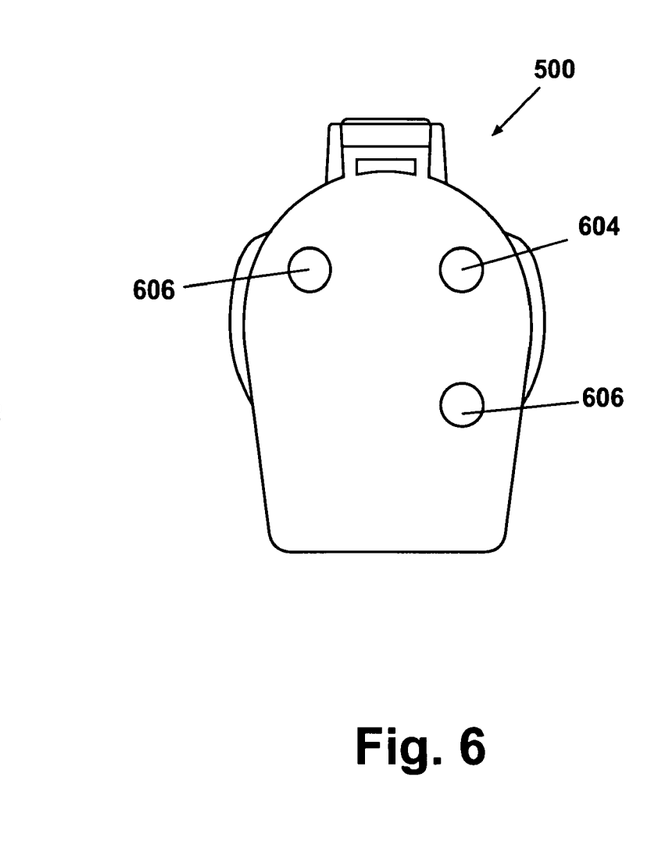
FIG. 6 is a top view of a four prong 240 volt outlet tester, according to an embodiment.

FIG. 6 is a top view of a four prong 240 volt outlet tester 500. The four prong 240 volt outlet tester 500 may have three indicator lights 602, 604, 606 integrated into the housing 502. The indicator lights 602, 604, 606 may be composed from long life, impact resistant materials. For example, the indicator lights 602, 604, 606 may be LED or neon lights.

The indicator lights 602, 604, 606 may be used to identify a wiring status of the wiring to the four wire 240 volt outlet. For example, if the wiring to the four wire 240 volt outlet is correct and the 240 volt outlet tester 500 is placed into the outlet, the indicator lights 602, 604, 606 may illuminate. In a preferred embodiment, the indicator lights 602, 604, 606 illuminate green (i.e., green indicating that the wiring to the outlet is correct). Additional information regarding how the indicator lights 602, 604, 606 may be used to identify the wiring status of the four wire 240 volt outlet is described with reference to FIG. 8.

The four prong 240 volt outlet tester 500 may include a test circuit within the housing 502. The test circuit may be connected to the four prongs 506 and to the indicator lights 602, 604, 606. The test circuit is designed to detect whether the four wire 240 volt outlet has been wired correctly.

Figure 7:
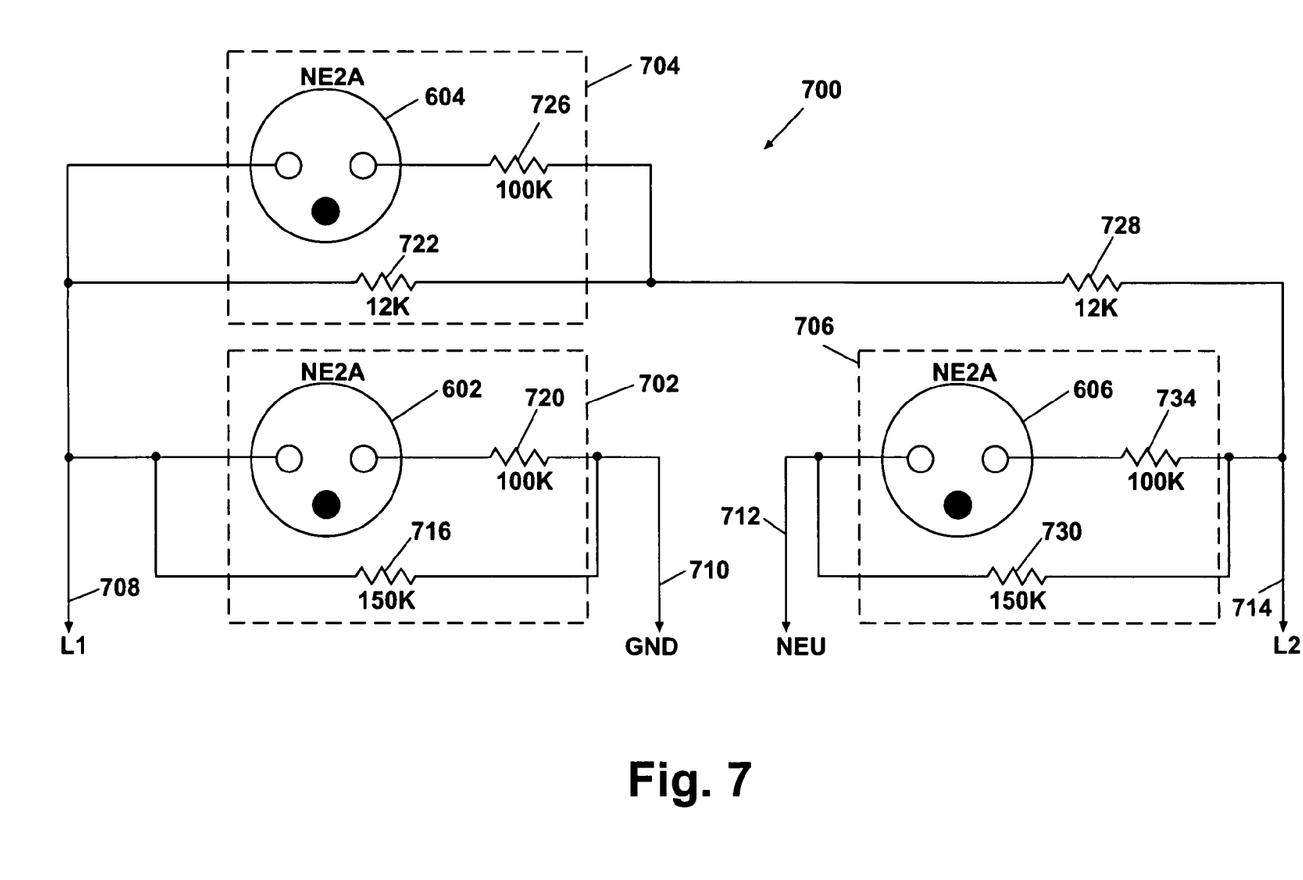
FIG. 7 is a circuit diagram for a test circuit located within the four prong 240 volt outlet tester depicted in FIG. 5, according to an embodiment.

FIG. 7 is a circuit diagram of a test circuit 700 located within the housing 502 of the four prong 240 volt outlet tester 500 depicted in FIG. 5. The test circuit 700 includes three parallel circuits 702, 704, 706. The first parallel circuit 702 is located between a first live terminal 708 and a ground terminal 710 and includes a first parallel resistor 716 connected in parallel with a first indicator light 602 connected in series to a first series resistor 720. The first parallel resistor 716 may discharge capacitance created by a long length of house wiring. The first series resistor 720 may be a current limiter for the first indicator light 602.

In a preferred embodiment, the first parallel resistor 716 has a resistance of about 150 kilo ohms and the first series resistor 720 has a resistance about 100 kilo ohms. Other resistance values may be used. The first indicator light 602 may be an NE2A neon bulb; however, other indicator lights may be used.

The second parallel circuit 704 is located between the first live terminal 708 and a second live terminal 714 and includes a second parallel resistor 722 connected in parallel with a second indicator light 604 connected in series to a second series resistor 726. A line resistor 728 may be connected in series between the second parallel circuit 704 and the second live terminal 714. The second parallel resistor 722 and the line resistor 728 may discharge capacitance created by a long length of house wiring. The second series resistor 726 may be a current limiter for the second indicator light 604.

In a preferred embodiment, the second parallel resistor 722 has a resistance of about 12 kilo ohms, the second series resistor 726 has a resistance about 100 kilo ohms, and the line resistor 728 has a resistance about 12 kilo ohms. Other resistance values may be used. The second indicator light 604 may be an NE2A neon bulb; however, other indicator lights may be used.

The third parallel circuit 706 is located between a neutral terminal 712 and the second live terminal 714 and includes a third parallel resistor 730 connected in parallel with a third indicator light 606 connected in series to a third series resistor 734. The third parallel resistor 730 may discharge capacitance created by a long length of house wiring. The third series resistor 734 may be a current limiter for the third indicator light 606.

In a preferred embodiment, the third parallel resistor 730 has a resistance of about 150 kilo ohms and the third series resistor 734 has a resistance about 100 kilo ohms. Other resistance values may be used. The third indicator light 606 may be an NE2A neon bulb; however, other indicator lights may be used.

Figure 8:
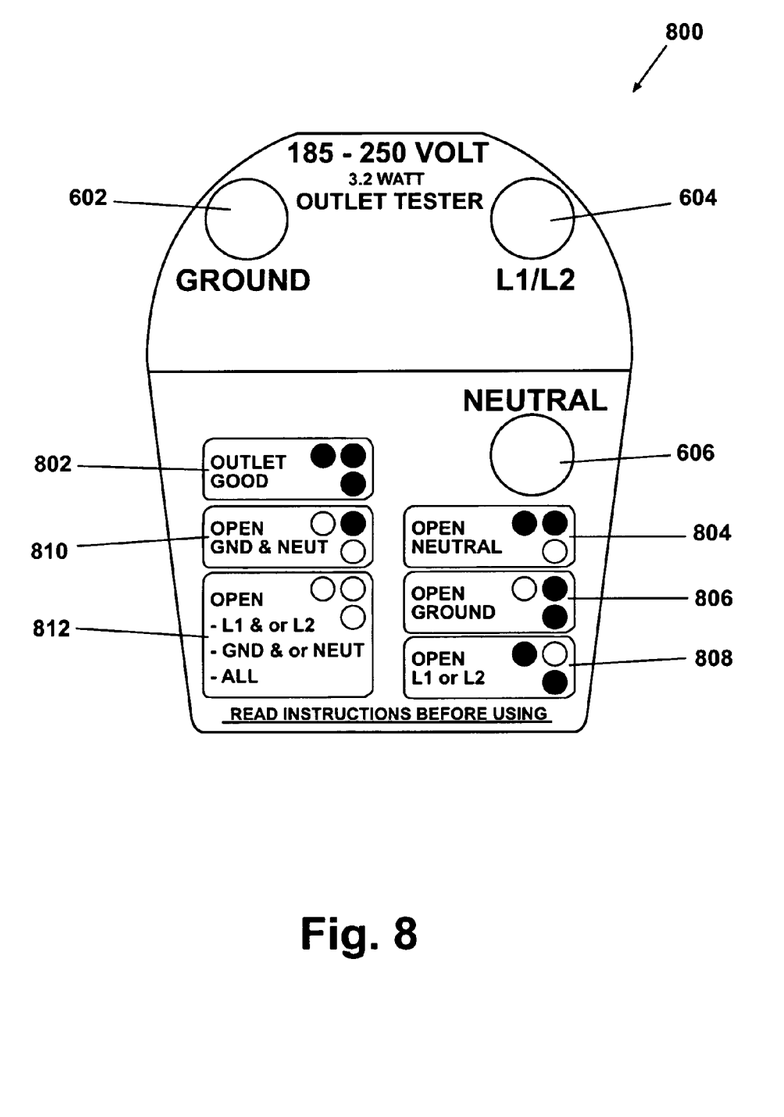
FIG. 8 is a label for use on the four prong 240 volt outlet tester depicted in FIG. 5, according to an embodiment.

FIG. 8 is a label 800 for use on the four prong 240 volt outlet tester 500 depicted in FIG. 5. The label 800, which may be attached to the top side of the four pronged 240 volt outlet tester 500, may be useful to explain how the test circuit 500 including the indicator lights 602, 604, 606 may be used to identify whether a four wire 240 volt outlet is correctly wired. After the four prong 240 volt outlet tester 500 is placed into a four wire 240 volt outlet, the indicator lights 602, 604, 606 may or may not illuminate. An illumination pattern may provide a status of the wiring to the four wire 240 volt outlet.

If the wiring to the 240 volt outlet is correct, the indicator lights 602, 604, 606 may all illuminate as depicted in block 802. If the wiring to the neutral terminal is incorrect, the first and second indicator lights 602, 604 may illuminate, but not the third indicator light 606 as depicted in block 804. If the wiring to the ground terminal is incorrect, the second and third indicator lights 604, 606 may illuminate, but not the first indicator light 602 as depicted in block 806. If the wiring to one of the two hot terminals is incorrect, the first and third indicator lights 602, 606 may illuminate, but not the second indicator light 604 as depicted in block 808. If the wiring to both the ground and the neutral terminals is incorrect, the second indicator light 604 may illuminate, but not the first and third indicator lights 602, 606 as depicted in block 810. If the wiring of the neutral terminal, the ground terminal, and one of the live terminals is incorrect, none of the indicator lights 602, 604, 606 may illuminate as depicted in block 812. The following table summarizes the illumination pattern for the four prong 240 volt outlet tester 500.

| 240 Volt Outlet Status | Ground 602 | L1/L2 604 | Neutral 606 |
| --- | --- | --- | --- |
| Wired Correctly | ON | ON | ON |
| Neutral Terminal Improperly Wired | ON | ON | OFF |
| Ground Terminal Improperly Wired | OFF | ON | ON |

-continued

| 240 Volt Outlet Status | Ground 602 | L1/L2 604 | Neutral 606 |
|---|---|---|---|
| Live Terminal Improperly Wired | ON | OFF | ON |
| Both Neutral and Ground Terminal Improperly Wired | OFF | ON | OFF |
| Live Terminal and Ground and/or Neutral Terminal Improperly Wired | OFF | OFF | OFF |

As described above, the 240 volt outlet tester may identify the status of the wiring to a 240 volt outlet after the tester has been inserted into the 240 volt outlet. If a 240 volt outlet is correctly wired, all the indicator lights may illuminate. If the 240 volt outlet is improperly wired, one or more indicator lights might not illuminate. The illumination pattern may be used to determine how the 240 volt outlet is improperly wired. By identifying an improperly wired 240 volt outlet prior to usage, damage to electronic devices that may be plugged into such an outlet may be avoided.

It should be understood that the illustrated embodiments are examples only and should not be taken as limiting the scope of the present invention. For example, the resistance values may be changed and electrically equivalent parallel circuits may alternatively be used. The claims should not be read as limited to the described order or elements unless stated to that effect. Therefore, all embodiments that come within the scope and spirit of the following claims and equivalents thereto are claimed as the invention.

We claim:

1. A three prong 240 volt outlet tester, comprising in combination:
    a housing having three electrically conductive prongs that extend from a base of the housing and that are designed to fit into a three wire 240 volt outlet, and when plugged into the three wire 240 volt outlet, the three prongs comprise a first live terminal, a second live terminal, and a neutral terminal;
    a first indicator light and a second indicator light integrated into the housing; and
    a circuit located within the housing designed to test wiring to the three wire 240 volt outlet, wherein the circuit includes a first parallel circuit and a second parallel circuit, wherein the first parallel circuit is connected between the first live terminal and the neutral terminal and includes a first resistor connected in parallel with the first indicator light, wherein the second parallel circuit is connected between the first live terminal and the second live terminal and includes a second resistor connected in parallel with the second indicator light.

2. The three prong 240 volt outlet tester of claim 1, wherein the first and second indicator lights identify a status of the wiring to the 240 volt outlet when the three prong 240 volt outlet tester is inserted into the three wire 240 volt outlet.

3. The three prong 240 volt outlet tester of claim 1, wherein the first resistor has a resistance of about 150 kilo ohms and the second resistor has a resistance of about 12 kilo ohms.

4. The three prong 240 volt outlet tester of claim 1, further comprising a third resistor connected in series with the first indicator light and a fourth resistor connected in series with the second indicator light.

5. The three prong 240 volt outlet tester of claim 4, wherein the third and fourth resistors have a resistance of about 100 kilo ohms.

6. The three prong 240 volt outlet tester of claim 1, further comprising a line resistor connected between the second parallel circuit and the second live terminal.

7. The three prong 240 volt outlet tester of claim 6, wherein the line resistor has a resistance of about 12 kilo ohms.

8. A four prong 240 volt outlet tester, comprising in combination:
    a housing having four electrically conductive prongs that extend from a base of the housing and are designed to fit into a four wire 240 volt outlet, and when plugged into the four wire 240 volt outlet, the four prongs comprise a first live terminal, a second live terminal, a neutral terminal, and a ground terminal;
    a first indicator light, a second indicator light, and a third indicator light integrated into the housing; and
    a circuit located within the housing designed to test wiring to the four wire 240 volt outlet, wherein the circuit includes a first parallel circuit, a second parallel circuit, and a third parallel circuit, wherein the first parallel circuit is connected between the first live terminal and the ground terminal and includes a first resistor connected in parallel with the first indicator light, wherein the second parallel circuit is connected between the first live terminal and the second live terminal and includes a second resistor connected in parallel with the second indicator light, and wherein the third parallel circuit is connected between the second live terminal and the neutral terminal and includes a third resistor connected in parallel with the third indicator light.

9. The four prong 240 volt outlet tester of claim 8, wherein the first, second, and third indicator lights identify a status of the wiring to the 240 volt outlet when the four prong 240 volt outlet tester is inserted into the four wire 240 volt outlet.

10. The four prong 240 volt outlet tester of claim 8, wherein the first resistor and the third resistor have a resistance of about 150 kilo ohms and the second resistor has a resistance of about 12 kilo ohms.

11. The four prong 240 volt outlet tester of claim 8, further comprising a fourth resistor connected in series with the first indicator light, a fifth resistor connected in series with the second indicator light, and a sixth resistor connected in series with the third indicator light.

12. The four prong 240 volt outlet tester of claim 11, wherein the fourth, fifth, and sixth resistors have a resistance of about 100 kilo ohms.

13. The four prong 240 volt outlet tester of claim 8, further comprising a line resistor connected between the second parallel circuit and the second live terminal.

14. The four prong 240 volt outlet tester of claim 13, wherein the line resistor has a resistance of about 12 kilo ohms.

15. A method for testing wiring to a three wire 240 volt outlet, comprising in combination:
    connecting a first parallel circuit between a first live terminal of the 240 volt outlet and a neutral terminal of the 240 volt outlet, wherein the first parallel circuit includes a first resistor connected in parallel with a first indicator light; and
    connecting a second parallel circuit between the first live terminal of the 240 volt outlet and a second live terminal of the 240 volt outlet, wherein the second parallel circuit includes a second resistor connected in parallel with a second indicator light.

16. The method of claim 15, wherein the first and second indicator lights identify a status of the wiring to the 240 volt outlet.

17. The method of claim 15, wherein the first resistor has a resistance of about 150 kilo ohms and the second resistor has a resistance of about 12 kilo ohms.

18. The method of claim 15, further comprising connecting a third resistor in series with the first indicator light and a fourth resistor in series with the second indicator light.

19. The method of claim 18, wherein the third and fourth resistors have a resistance of about 100 kilo ohms.

20. The method of claim 15, further comprising connecting a line resistor between the second parallel circuit and the second live terminal.

21. The method of claim 20, wherein the line resistor has a resistance of about 12 kilo ohms.

22. A method for testing wiring to a four wire 240 volt outlet, comprising in combination:
   connecting a first parallel circuit between a first live terminal of the 240 volt outlet and a ground terminal of the 240 volt outlet, wherein the first parallel circuit includes a first resistor connected in parallel with a first indicator light;
   connecting a second parallel circuit between the first live terminal of the 240 volt outlet and a second live terminal of the 240 volt outlet, wherein the second parallel circuit includes a second resistor connected in parallel with a second indicator light; and
   connecting a third parallel circuit between the second live terminal of the 240 volt outlet and a neutral terminal of the 240 volt outlet, wherein the third parallel circuit includes a third resistor connected in parallel with a third indicator light.

23. The method of claim 22, wherein the first, second, and third indicator lights identify a status of the wiring to the 240 volt outlet.

24. The method of claim 22, wherein the first resistor and the third resistor have a resistance of about 150 kilo ohms and the second resistor has a resistance of about 12 kilo ohms.

25. The method of claim 22, further comprising connecting a fourth resistor in series with the first indicator light, connecting a fifth resistor in series with the second indicator light, and connecting a sixth resistor in series with the third indicator light.

26. The method of claim 25, wherein the fourth, fifth, and sixth resistors have a resistance of about 100 kilo ohms.

27. The method of claim 22, further comprising connecting a line resistor between the second parallel circuit and the second live terminal.

28. The method of claim 27, wherein the line resistor has a resistance of about 12 kilo ohms.

* * * * *